United States Patent
Perley et al.

(10) Patent No.: US 11,445,603 B2
(45) Date of Patent: Sep. 13, 2022

(54) COMPONENT VERTICAL MOUNTING

(71) Applicant: Hamilton Sundstrand Corporation, Charlotte, NC (US)

(72) Inventors: David Perley, Manchester, CT (US); Kenneth J. Trotman, Granby, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 939 days.

(21) Appl. No.: 16/224,023

(22) Filed: Dec. 18, 2018

(65) Prior Publication Data

US 2019/0124762 A1     Apr. 25, 2019

Related U.S. Application Data

(62) Division of application No. 15/332,659, filed on Oct. 24, 2016.

(51) Int. Cl.
*H05K 1/02*     (2006.01)
*H01L 23/367*     (2006.01)
(Continued)

(52) U.S. Cl.
CPC ........... *H05K 1/0272* (2013.01); *H01L 23/34* (2013.01); *H01L 23/367* (2013.01); *H01L 23/42* (2013.01);
(Continued)

(58) Field of Classification Search
CPC ....... H01L 23/34; H01L 23/367; H01L 23/42; H05K 1/0203; H05K 1/0209;
(Continued)

(56) References Cited

U.S. PATENT DOCUMENTS 5,470,795 A     11/1995     Shushurin
7,095,226 B2     8/2006     Wan et al.
(Continued)

FOREIGN PATENT DOCUMENTS

JP     H08288437 A     11/1996
JP     H09153576 A     6/1997
(Continued)

OTHER PUBLICATIONS

Partial European Search Report dated Feb. 26, 2018 issued during the prosecution of European Patent Application No. EP 14197067.6 (10 pages).
(Continued)

*Primary Examiner* — Carl J Arbes
(74) *Attorney, Agent, or Firm* — Locke Lord LLP; Joshua L. Jones; Scott D. Wofsy

(57) ABSTRACT

A circuit component arrangement includes a base and a plurality of circuit components mounted to the base. A bonding agent adheres the circuit components in intimate contact to the base. The bonding agent is disposed in a respective open channel defined in an outward facing surface of the base in contact with each of the circuit components. A method of assembling a circuit component arrangement includes temporarily fastening a plurality of circuit components to a base. A bonding agent is injected into a respective open channel defined in the base to adhere each of the plurality of circuit components to the base. The plurality of circuit components are unfastened from the base.
(Continued)

Injecting a bonding agent can include ceasing injection of bonding agent upon appearance of bonding agent in a window opening in fluid communication with the open channel.

3 Claims, 1 Drawing Sheet

(51) Int. Cl.
*H01L 23/42* (2006.01)
*H05K 3/30* (2006.01)
*H05K 7/02* (2006.01)
*H01L 23/34* (2006.01)
*H05K 13/04* (2006.01)

(52) U.S. Cl.
CPC ......... *H05K 1/0203* (2013.01); *H05K 1/0209* (2013.01); *H05K 3/306* (2013.01); *H05K 7/02* (2013.01); *H05K 13/046* (2013.01); *H05K 2201/06* (2013.01); *H05K 2201/066* (2013.01); *H05K 2201/10166* (2013.01); *H05K 2203/17* (2013.01)

(58) Field of Classification Search
CPC ........ H05K 1/0272; H05K 3/306; H05K 7/02; H05K 13/046; H05K 2201/06; H05K 2201/066; H05K 2201/10166; H05K 2203/17

See application file for complete search history.

(56) References Cited

U.S. PATENT DOCUMENTS

| | | | |
|---|---|---|---|
| 8,542,490 | B2 | 9/2013 | Kokas et al. |
| 8,624,380 | B2 | 1/2014 | Xue et al. |
| 8,766,430 | B2 | 7/2014 | Otremba et al. |
| 8,981,560 | B2 | 3/2015 | Jensen et al. |
| 2005/0264998 | A1 | 12/2005 | McCutcheon et al. |
| 2010/0271785 | A1 | 10/2010 | Hsieh et al. |
| 2010/0302729 | A1 | 12/2010 | Tegart et al. |

FOREIGN PATENT DOCUMENTS

| | | |
|---|---|---|
| JP | 2865166 B1 | 3/1999 |
| JP | 2002158316 A | 5/2002 |
| JP | 2005086019 A | 3/2005 |

OTHER PUBLICATIONS

Extended European Search Report issued in corresponding European Patent Application No. EP17197067.6, dated Jul. 30, 2018.
Extended European Search Report dated Jun. 26, 2020, issued during the prosecution of European Patent Application No. EP 20160437.8.

COMPONENT VERTICAL MOUNTING

CROSS-REFERENCE TO RELATED APPLICATIONS

This application is a divisional of U.S. patent application Ser. No. 15/332,659 filed Oct. 24, 2016, the contents of which are incorporated by reference herein in their entirety.

BACKGROUND OF THE INVENTION

1. Field of the Invention

The present disclosure relates to electrical components such as those mounted to printed wiring boards (PWBs), and more particularly to mounting such components such as to PWBs or the like.

2. Description of Related Art

Circuit Card Assemblies (CCAs) are used in computers, such as aircraft computers. It is desirable to minimize overall size of such computers, so a key design practice is to maximally utilize CCA area while still managing thermal and structural aspects of the design appropriately. For example, power regulating components require thermal management and typically utilize large areas on the PWB of the CCA. Traditional mounting methods require specific fasteners and electrical isolation techniques to avoid shorting of the part body to the PWB or other components mounted to the PWB.

The conventional techniques have been considered satisfactory for their intended purpose. However, there is an ever present need for improved component mounting. This disclosure provides a solution for this need.

SUMMARY OF THE INVENTION

A circuit component arrangement includes a base and a plurality of circuit components mounted to the base. An injectable bonding agent, e.g., a thermal bonding agent, adheres the circuit components in intimate contact to the base. The bonding agent is disposed in a respective open channel defined in an outward facing surface of the base in contact with each of the circuit components.

The channel can include an inlet passage passing from a surface of the base in fluid communication with the open channel for filling the bonding agent into the open channel. The inlet passage can have an opening defined on a surface of the base adjacent the outward facing surface in which the open channel is defined. The inlet passage can define an internal flow passage. The internal flow passage can have a smaller flow area than that of the open channel.

The open channel can be in fluid communication with a window opening defined in a surface of the base. The window opening can be visible for confirmation that the open channel is filled with bonding agent with a circuit component pressed against the open channel. The window opening can be defined on the outward facing surface of the base in which the open channel is defined. The window opening can be at a terminus of the open channel. The window opening can have a smaller channel width than that of the open channel.

The circuit components can have a width extending in a longitudinal direction along the base, and a height perpendicular to the width that is greater than the width for mounting the circuit components to a planar circuit card assembly (CCA) vertically relative to a plane defined by the CCA. The circuit components can include transistors arranged in a horizontally (e.g., along the plane of the CCA) tiled pattern along the base. The base can include two opposes sides, each having a plurality of circuit components mounted thereto, with respective open channels and bonding agent adhering the circuit components to the base.

A method of assembling a circuit component arrangement includes temporarily fastening a plurality of circuit components to a base. A bonding agent is injected into a respective open channel defined in the base to adhere each of the plurality of circuit components to the base. Any fasteners that temporarily fastened the circuit components to the base are removed. Injecting a bonding agent can include injecting the bonding agent through an inlet opening into each respective open channel. Injecting a bonding agent can include ceasing injection of bonding agent upon appearance of bonding agent in a window opening in fluid communication with the open channel.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
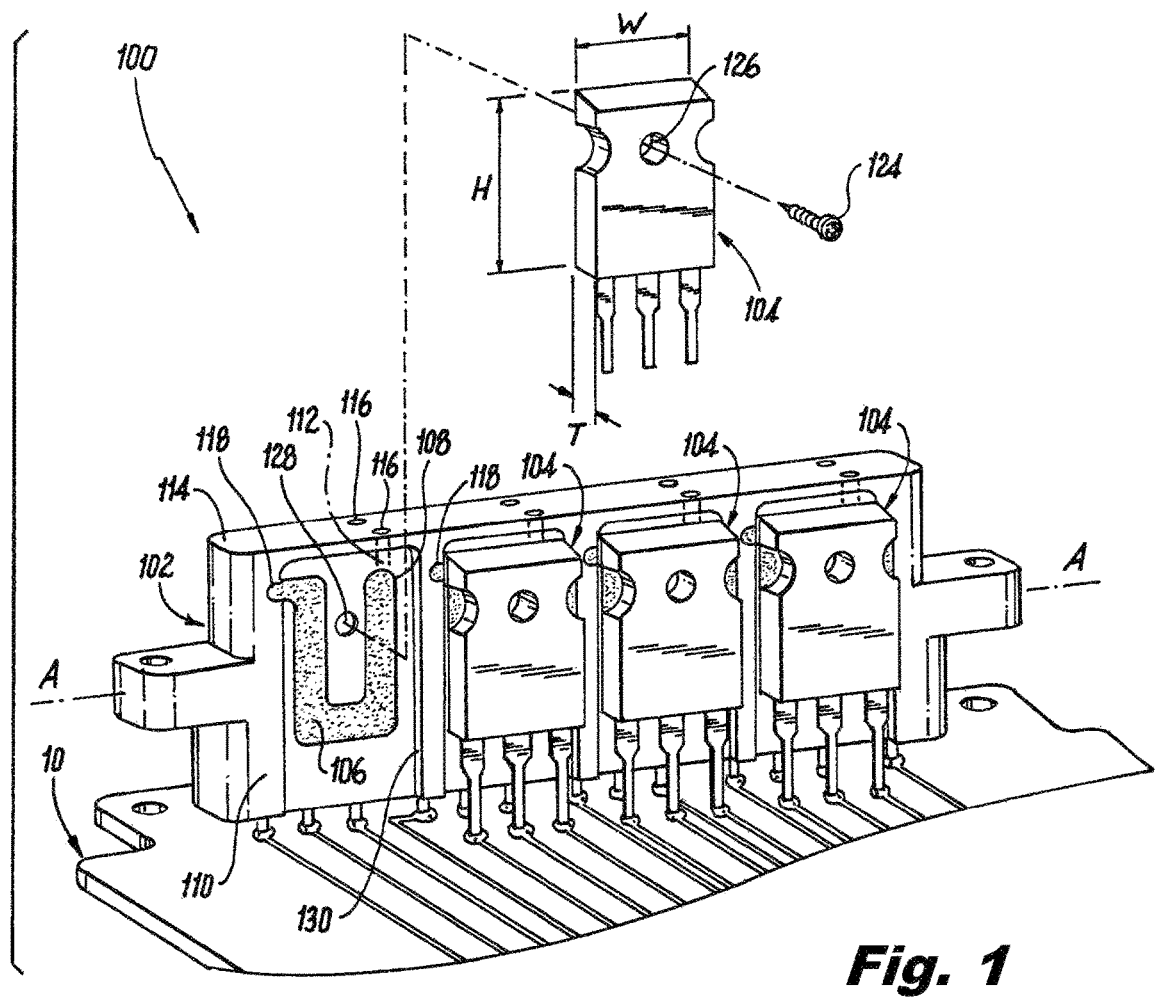
FIG. 1 is a partially exploded perspective view of an exemplary embodiment of a circuit component arrangement constructed in accordance with the present disclosure, showing multiple components mounted to a base vertically relative to a plane defined by the circuit card assembly (CCA)

Reference will now be made to the drawings wherein like reference numerals identify similar structural features or aspects of the subject disclosure. For purposes of explanation and illustration, and not limitation, a partial view of an exemplary embodiment of a circuit component arrangement in accordance with the disclosure is shown in FIG. 1 and is designated generally by reference character 100. Other embodiments of circuit component arrangements in accordance with the disclosure, or aspects thereof, are provided in FIG. 2, as will be described. The systems and methods described herein can be used to vertically mount circuit components to printed wiring boards (PWBs) to form circuit card assemblies (CCAs) or the like with improved form factor compared to traditional arrangements, while providing superior thermal management.

Circuit component arrangement 100 includes a base 102 and a plurality of circuit components 104 mounted to the base 102. A thermally conductive injectable thermal bonding agent 106 adheres the circuit components 104 in intimate thermal contact to the base 102 so base 102 can serve as a heat sink or thermal pathway to a heat sink for circuit components 104. The thermal bonding agent 106 is disposed in a respective open channel 108 defined in an outward facing surface 110 of the base 102 in contact with each of the circuit components 104. Each channel 108 is defines a labyrinthine bond path, e.g., a U-shaped path. While only one of the open channels 108 is shown in FIG. 1, it is to be understood that a similar open channel 108 is provided for each circuit component 104.

Each channel 108 includes an inlet passage 112 passing from top surface 114 of the base 102. Each inlet passage 112 is in fluid communication with the respective open channel 108 for filling the thermal bonding agent 106 into the open channel 108. Each inlet passage 112 has an opening 116 defined top surface 114 of the base 102 adjacent the outward facing surface 110 in which the open channel 108 is defined. The inlet passage 112 defines an internal flow passage for thermal bonding agent 106 to flow during assembly. The internal flow passage has a smaller flow area than that of the open channel 108.

The open channel 108 is in fluid communication with a window opening 118 defined in surface 110 of the base 102. The window 118 is visible to the side of each circuit component 104 for confirmation that the open channel 108 is filled with thermal bonding agent 106 with the circuit component 104 pressed against the open channel 108. The window opening 118 is defined on the outward facing surface 110 of the base 102 in which the open channel 108 is defined. The window opening 118 is at a terminus of the open channel 108. The window opening 118 has a smaller channel width than that of the open channel 108. Bond agent 106 when visible in window opening 118 serves as a visual indication that the open channel 108 is adequately filled with bonding agent 106.

The circuit components can have a width W extending in a longitudinal direction along the base (i.e., along longitudinal axis A in FIG. 1), and a height H perpendicular to the width that is greater than the width (H>W) for mounting the circuit components 104 to a planar circuit card assembly (CCA) 10 with the circuit components 104 oriented vertically relative to the plane defined by the CCA 10 as shown in FIG. 1. Height H (where height is in the vertical direction relative to the plane defined by CCA as shown in FIG. 1) is similarly greater than thickness T of the circuit card assemblies orthogonal to height H and width W, so the largest dimension of the circuit components 104 is ultimately perpendicular to the plane of CCA 10. The circuit components 104 include transistors arranged in a horizontally (along the plane defined by CCA 10) tiled pattern along the base 102, however, those skilled in the art will readily appreciate that any other suitable type of circuit components can be used without departing from the scope of this disclosure.

Figure 2:
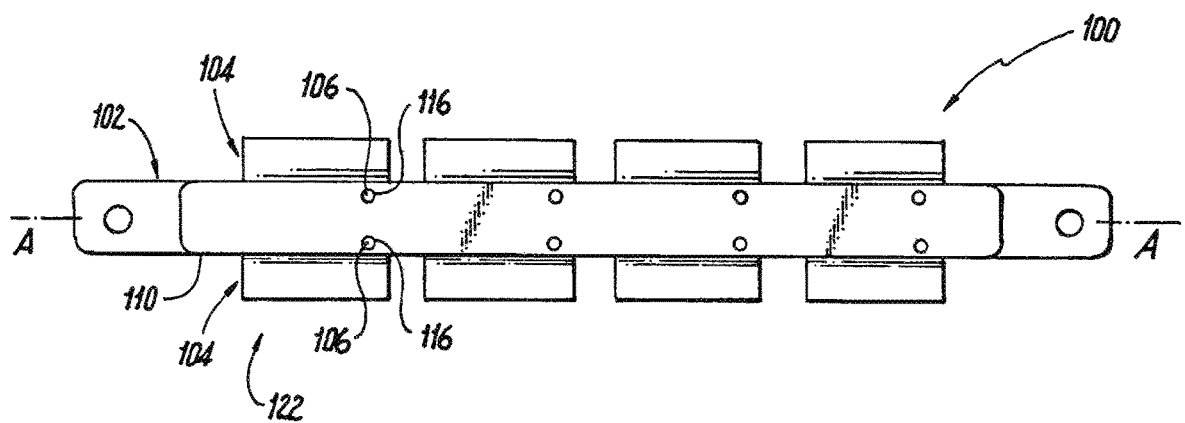
FIG. 2 is a plan view of the component arrangement of FIG. 1, showing circuit components mounted on opposed sides of the base.

With reference now to FIG. 2, the base 102 includes two opposes sides 120 and 122, each having a plurality of circuit components 104 mounted thereto, with respective open channels 108 and thermal bonding agent adhering the circuit components to the base (as shown in FIG. 1). Those skilled in the art will readily appreciate that circuit components 104 can be mounted on only a single side of a base, e.g., by omitting the circuit components 104 on side 122 of base 102, without departing from the scope of this disclosure. Moreover, those skilled in the art will readily appreciate that while four circuit components 104 are shown on each side of base 102, any suitable number of components can be ganged on base 102 without departing from the scope of this disclosure.

A method of assembling a circuit component arrangement, e.g., circuit component arrangement 100, includes temporarily fastening a plurality of circuit components, e.g., circuit components 104, to a base, e.g., base 102. This can be accomplished using a respective fastener such as fastener 124 of FIG. 1 to secure each circuit component temporarily to the base through the bores 126 and 128. Bore 128 serves as a first component locating feature, and ridge 130 defined in outward facing surface 110 defines a second component locating feature to help ensure proper positioning of each circuit component 104. A bonding agent, e.g., thermal bonding agent 106, is injected into a respective open channel, e.g., open channel 108, defined in the base to adhere each of the plurality of circuit components to the base. The plurality of circuit components are unfastened from the base, e.g. by removing the fasteners leaving the circuit components adhered to the base by the bonding agent to reduce weight and/or bulk such as in aerospace applications. Injecting a bonding agent can include injecting the bonding agent through an inlet opening, e.g., inlet openings 116, into each respective open channel. Injecting a bonding agent can include ceasing injection of bonding agent upon appearance of bonding agent in a window opening, e.g., window openings 118, in fluid communication with the open channel.

The methods and systems of the present disclosure, as described above and shown in the drawings, provide for circuit component assemblies with superior properties including vertical mounting with effective heat sinking/thermal management. While the apparatus and methods of the subject disclosure have been shown and described with reference to preferred embodiments, those skilled in the art will readily appreciate that change and/or modification may be made thereto without departing from the scope of the subject disclosure.

What is claimed is:

1. A method of assembling a circuit component arrangement comprising:
    temporarily fastening at least one circuit component to a base;
    injecting a bonding agent into a respective open channel defined in the base to adhere each of the at least one circuit component to the base; and
    removing any fasteners that temporarily fastened the at least one circuit component to the base.

2. A method as recited in claim 1, wherein injecting a bonding agent includes injecting the bonding agent through an inlet opening into each respective open channel.

3. A method as recited in claim 1, wherein injecting a bonding agent includes ceasing injection of bonding agent upon appearance of bonding agent in a window opening in fluid communication with the open channel.

* * * * *